United States Patent
Li et al.

(10) Patent No.: US 11,489,118 B2
(45) Date of Patent: Nov. 1, 2022

(54) RELIABLE RESISTIVE RANDOM ACCESS MEMORY

(71) Applicant: International Business Machines Corporation, Armonk, NY (US)

(72) Inventors: Baozhen Li, South Burlington, VT (US); Chih-Chao Yang, Glenmont, NY (US); Ernest Y Wu, Essex Junction, VT (US); Andrew Tae Kim, Orangevale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/291,598

(22) Filed: Mar. 4, 2019

(65) Prior Publication Data

US 2020/0287136 A1    Sep. 10, 2020

(51) Int. Cl.
    *H01L 45/00*    (2006.01)
(52) U.S. Cl.
    CPC ...... *H01L 45/1683* (2013.01); *H01L 45/1233* (2013.01); *H01L 45/1253* (2013.01); *H01L 45/1675* (2013.01); *H01L 45/08* (2013.01); *H01L 45/146* (2013.01); *H01L 45/147* (2013.01)
(58) Field of Classification Search
    CPC . H01L 45/08; H01L 45/1233; H01L 45/1253; H01L 45/146; H01L 45/147; H01L 45/1675; H01L 45/1683
    See application file for complete search history.

(56) References Cited

U.S. PATENT DOCUMENTS

| | | | |
|---|---|---|---|
| 8,039,372 B2 | 10/2011 | Min et al. | |
| 8,921,819 B2 | 12/2014 | Lin et al. | |
| 9,312,482 B2* | 4/2016 | Tu | G11C 11/5678 |
| 9,431,604 B2 | 8/2016 | Liao et al. | |
| 9,466,794 B2 | 10/2016 | Yang et al. | |
| 9,553,265 B1* | 1/2017 | Yang | H01L 45/1666 |
| 9,806,255 B1 | 10/2017 | Hsu et al. | |
| 9,847,478 B2 | 12/2017 | Chang et al. | |
| 9,853,215 B1 | 12/2017 | Tseng et al. | |
| 2012/0181500 A1* | 7/2012 | Tsuji | H01L 27/2463 257/4 |
| 2017/0250223 A1 | 8/2017 | Ge et al. | |
| 2020/0212046 A1* | 7/2020 | Ishii | H01L 21/76846 |

* cited by examiner

*Primary Examiner* — Meiya Li
(74) *Attorney, Agent, or Firm* — Jeffrey S LaBaw; Steven J Meyers; L Jeffrey Kelly

(57) ABSTRACT

A resistive random access memory (RRAM) device and a method for constructing the device is described. A capping layer structure is provided over a bottom contact where the capping layer includes a recess situated over the bottom contact. A first portion of the recess is filled with a lower electrode such that the width of the recess defines the width of the lower electrode. A second portion of the recess is filled with a high-K layer so that a bottom surface of the high-K layer has a stepped profile. A top electrode is formed on the high-K layer and a top contact is formed on the top electrode. The width of the high-K layer is greater than the width of the lower electrode to prevent shorting between the top contact and the lower electrode of the RRAM device.

15 Claims, 15 Drawing Sheets

RELIABLE RESISTIVE RANDOM ACCESS MEMORY

BACKGROUND OF THE INVENTION

This disclosure relates to integrated circuit devices. More specifically, it relates to a method and structure to create resistive random access memory (RRAM) structures in semiconductor devices with improved reliability.

Computer memory is used to store information in modern computer systems. Resistive random-access memory (RRAM) is a type of non-volatile (NV) random-access (RAM) computer memory that works by changing the resistance across a dielectric solid-state material, often referred to as a memristor. RRAM is a promising technology for electronic computing, particularly in high-density and high-speed non-volatile memory applications. For example, in neuromorphic computing applications, a RRAM memory device can be used as a connection (synapse) between a pre-neuron and post-neuron, representing the connection weight in the form of device resistance. Multiple pre-neurons and post-neurons can be connected through a cross-bar array of RRAMs which expresses a fully-connected neural network.

The density of RRAM devices can be increased by vertically stacking RRAM stacks similar to that practiced in flash NAND technology. However, RRAM stacks are typically deposited by physical vapor deposition (PVD) to control the oxygen vacancy concentration in the metal oxide layer and this prevents application to 3-D structures.

Thus, it is desirable to provide processes which can be used to make improved RRAM structures for future computers.

BRIEF SUMMARY

According to this disclosure, a resistive random access memory (RRAM) device and a method for constructing the device. A capping layer structure is provided over a bottom contact where the capping layer includes a recess situated over the bottom contact. A first portion of the recess is filled with a lower electrode such that the width of the recess defines the width of the lower electrode. A second portion of the recess is filled with a high-K layer so that a bottom surface of the high-K layer has a stepped profile. A top electrode is formed on the high-K layer and a top contact is formed on the top electrode. The width of the high-K layer is greater than the width of the lower electrode to prevent shorting between the top contact and the lower electrode of the RRAM device.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
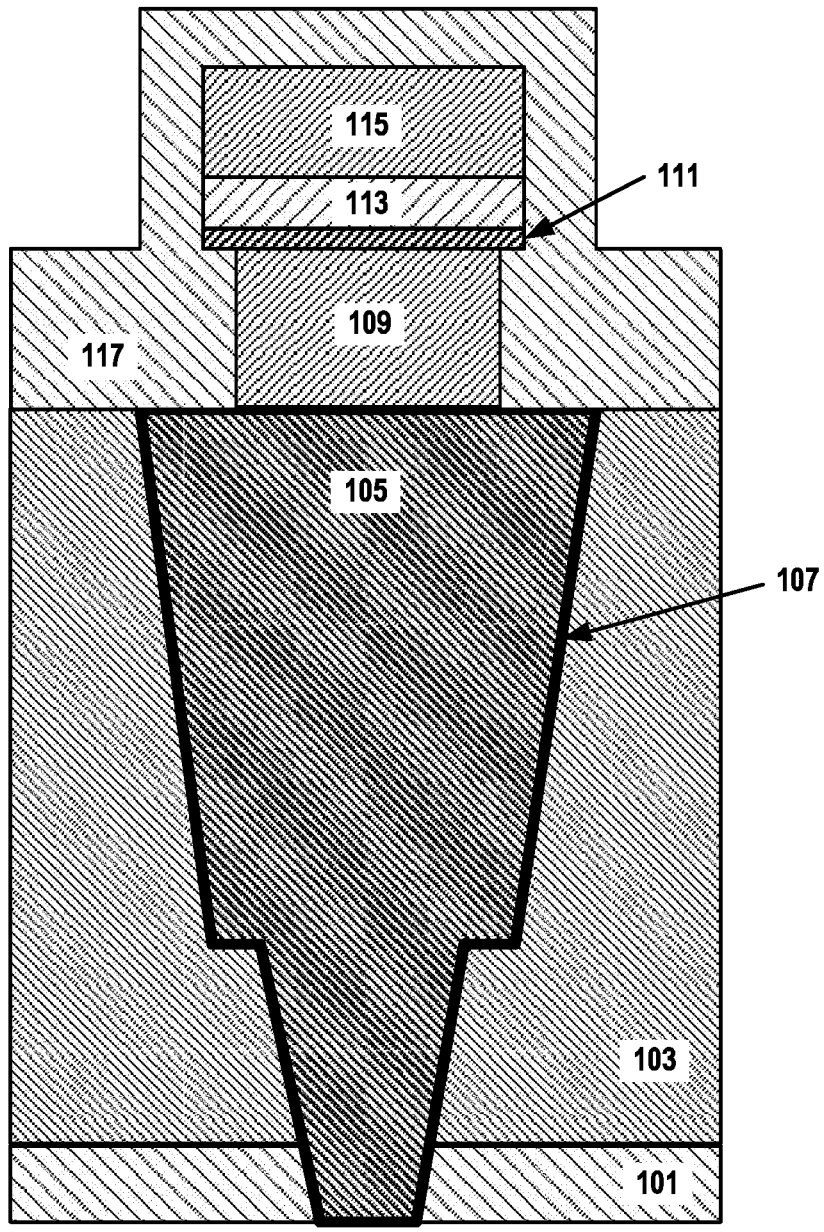
FIG. 1 is a cross-sectional diagram of a prior art structure prior to formation of the top contact structure.

At a high level, the invention includes structures and processes which prevent shorts between the bottom electrode and the top contact in an RRAM cell by extending a dimension, e.g., the lateral extent, of the high-K layer which separates them. In the prior art, the lateral dimension of the high-K layer would typically be determined by a step which would also determine the lateral dimension of the top electrode. Embodiments of the invention decouple the definition of the lateral dimension of the high-K layer from that of the top electrode. Other embodiments create topography which changes the shape of the high-K layer.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc. The substrate can also comprise dielectric materials as described below. Further, active devices may be embedded in the substrate.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein, unless specified, can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of $SiO_2$ and $Si_3N_4$, and metal oxides like tantalum oxide that have relative dielectric constants above that of $SiO_2$ (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram of a prior art structure prior to the formation of the top contact structure. In the drawing, a substrate 101 supports the first dielectric layer 103 and the bottom contact 105. The substrate 101 may include a combination of conductors, e.g., to connect to the bottom contact 105, dielectric material and devices which electrically couple with the RRAM device. A typical dielectric used for dielectric layer 103 is silicon dioxide ($SiO_2$), although other insulators such as low-k materials with k values less than 4.0 can be used. Copper is used as the main metal in the bottom contact 105. A barrier layer 107 such as TiN prevents diffusion of the copper into the dielectric 103.

The RRAM cell is built on top of the bottom contact 105. The RRAM cell is comprised of the bottom electrode 109, a barrier layer 111, a high-K layer 113 and the top electrode 115. Covering the RRAM cell is capping layer 117. The widths of high-K layer 113 and top electrode 115 are substantially equal to the width of the bottom electrode, for example, the widths of the high-K layer and the top layer were within 5 nm of each other.

The RRAM cell has two or more states with different electric resistance values. Each state represents a different digital value. The RRAM cell switches from one state to another by applying a predetermined voltage or current to the RRAM cell. For example, the RRAM cell has a state of relatively high resistance, referred to as "a high resistance state", and a state of relatively low resistance, referred to as "a low resistance state". The RRAM cell is switched from the high resistance state to the low resistance state, or from the low resistance state to high resistance state by applying a predetermined voltage or current.

Figure 2:
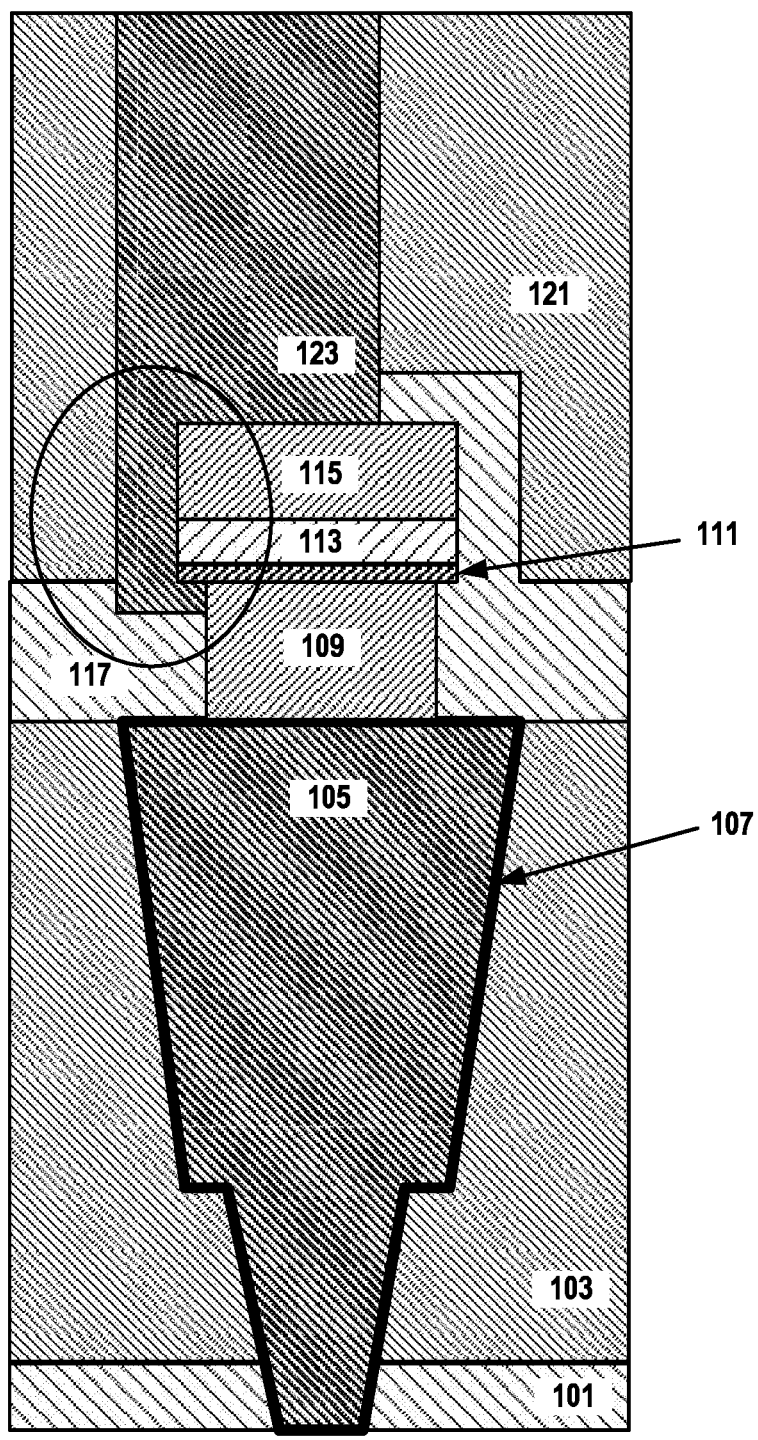
FIG. 2 is a cross-sectional diagram of a prior art structure after formation of the top contact structure illustrating the problems solved by the invention.

FIG. 2 is a cross-sectional diagram of a prior art structure after formation of the top contact structure illustrating the problems solved by the invention. In fabricating the top contact, first a dielectric layer 121 is deposited. Then, a recess is formed by a lithography step and an etch step, and then, the top contact 123 is formed using metal deposition. The top contact 123 is formed from copper or another metal. The problem occurs when the mask which is used to form the top contact 123 is slightly misaligned. As the top contact 123 is deep in the top dielectric 121, a long etch is required. Thus, a misaligned recess can reach down past the top electrode 115 and the high-K layer 113 to the barrier layer 111 (which is conductive) or even to the bottom electrode 109. As either of these situations will cause a short and a nonfunctional device, it is to be avoided.

Figure 3:
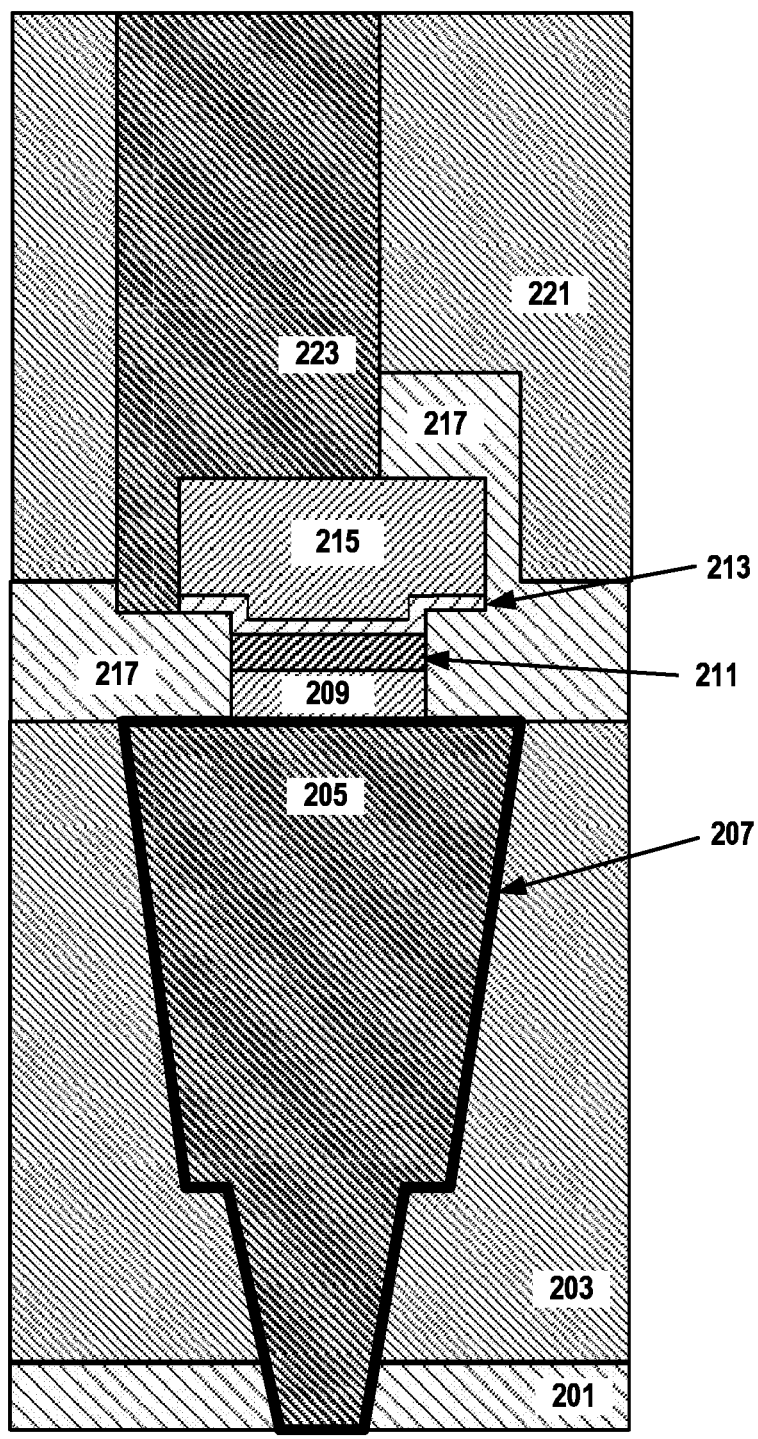
FIG. 3 is a cross-sectional diagram of a first embodiment of the invention illustrating how it solves the problems of the prior art.

FIG. 3 is a cross-sectional diagram of a first embodiment of the invention illustrating how it solves the problems of the prior art. In the drawing, a substrate 201 supports the first dielectric layer 203 and the bottom contact 205. In embodiments of the invention, the bottom contact 205 is conical in shape, although in other embodiments, the bottom contact is cylindrical or another shape. The substrate 201 contains conductors, dielectric and devices which connect to the bottom contact 205. A typical insulator used for dielectric layer 203 is silicon dioxide ($SiO_2$), although other insulators such as doped silicon glass (USG), fluorine-doped silicon glass (FSG) or other low-k dielectric materials, can be used. Other embodiments use other dielectric materials known to the art.

In embodiments of the invention, copper is used as the main metal in the bottom contact 205. A barrier layer 207 prevents diffusion of the copper into the dielectric 203. The bottom electrode 209, a barrier layer 211, a dielectric layer 213 and the top electrode 215 comprise the RRAM cell. Although the "barrier layer" 211 is depicted as thicker than the prior art, it is not necessary for the invention. The capping layer 217, preferably made of a dielectric such as silicon carbide (SiC), covers the RRAM cell.

The drawing shows misalignment of the top contact with respect to the bottom electrode. Note how in this embodiment, the widths of high-K layer 213 and top electrode 215 are much greater than the widths of the bottom electrode layer 209 and the barrier layer 211. Thus, even in the case of misalignment, because the top electrode is wider (and thus harder to miss, so misalignment is less likely in the first place), the top contact 221 will not come into contact with the bottom electrode layer 209 or barrier layer 211, but with the dielectric 217 instead. In embodiments of the invention, the widths of the high-K layer 213 and the top electrode 215 are at least 10 nm wider than the bottom electrode. In prior art, the high-K layer 213 is deposited on a flat surface. In the current embodiment, it is deposited in a patterned feature, resulting in a stepped profile.

Figure 4:
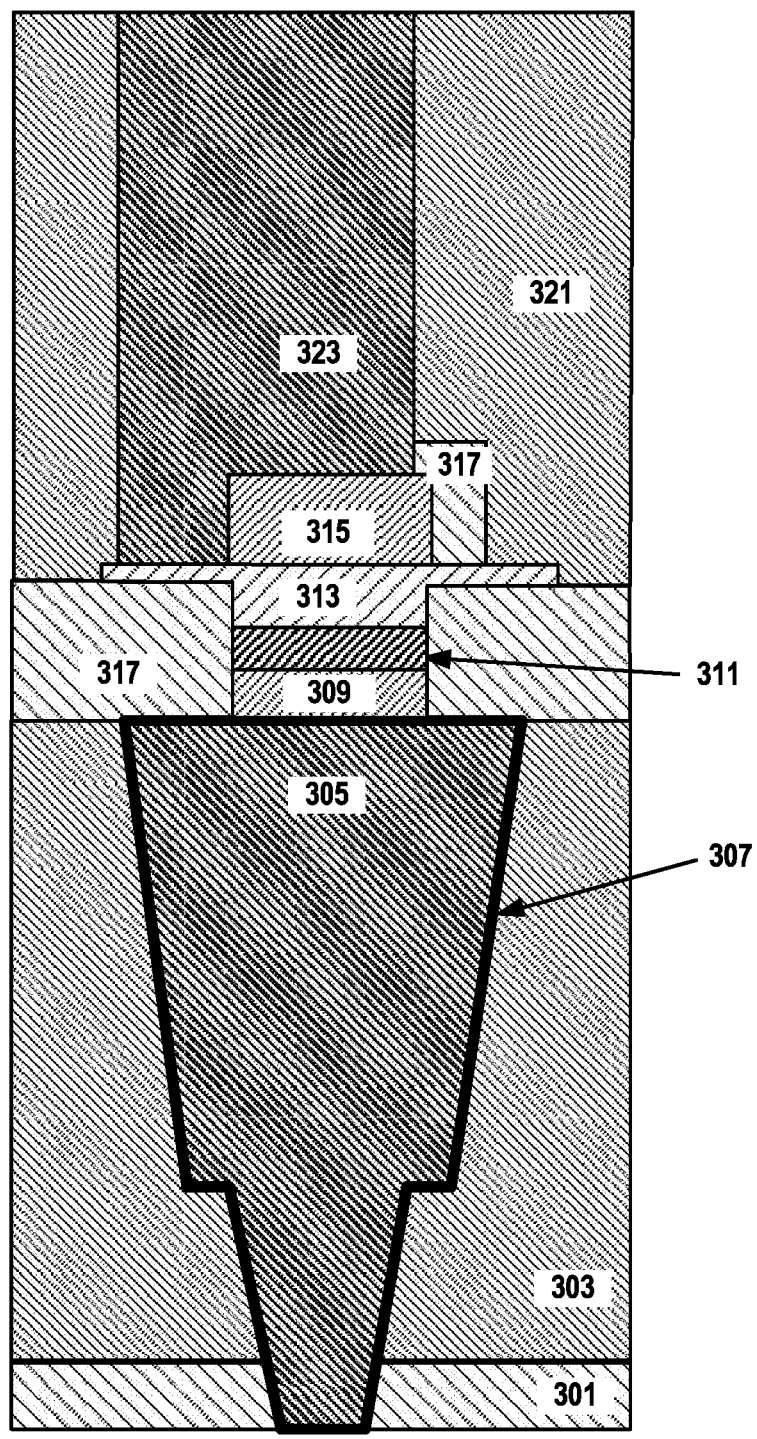
FIG. 4 is a cross-sectional diagram of a second embodiment of the invention illustrating how it solves the problems of the prior art.

FIG. 4 is a cross-sectional diagram of a second embodiment of the invention illustrating how it solves the problems of the prior art. In the drawing, as above, a substrate 301 supports the first insulator layer 303 and the bottom contact 305. Similar materials can be used in the first embodiment as described above.

The barrier layer 307 prevents diffusion of the metal used for the bottom contact 305 into the dielectric 303. The RRAM cell is comprised of the bottom electrode 309, the barrier layer 311, the dielectric layer 313 and the top electrode 315. A dielectric layer 317 covers the RRAM cell. The drawing shows misalignment of the top contact 323 with respect to the bottom electrode layers 309 and barrier layer 311. Note how in this embodiment, the width of high-K layer 313 is much greater than the width of the bottom electrode layer 309 and barrier layer 311 and top electrode layer 315. Thus, in the case of misalignment, the "wings" of the high-K 313 prevent the top contact 323 from contacting the bottom electrode layer 309 or the barrier layer 311.

Figure 5:
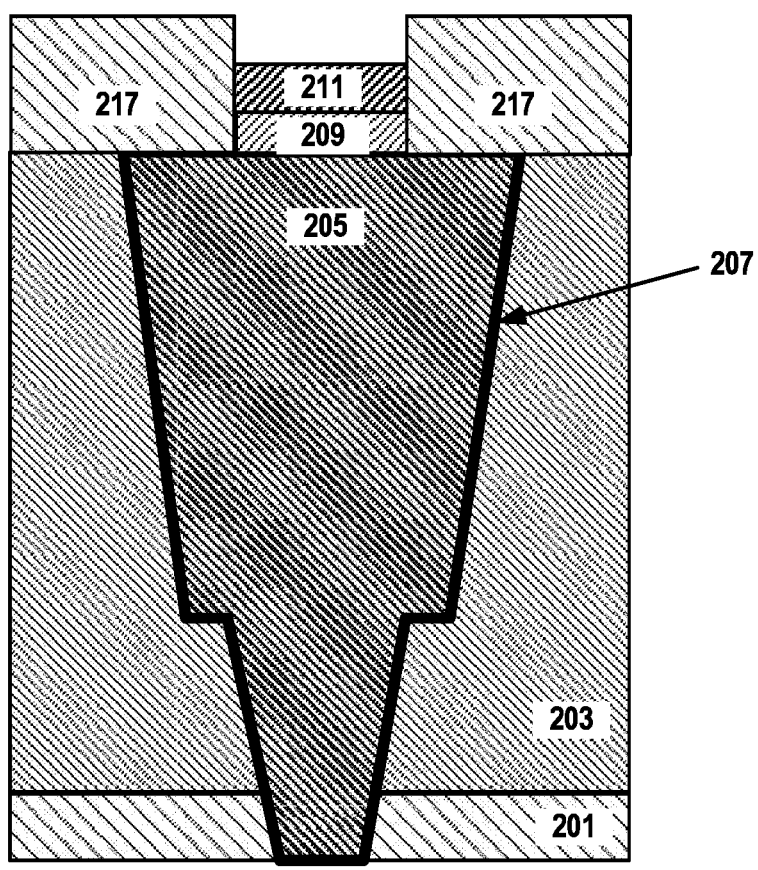
FIG. 5 is a cross-sectional diagram of the structure in a starting step of a process used to fabricate the first embodiment of the invention.

FIG. 5 is a cross-sectional diagram of the structure in an intermediate step of a process used to fabricate the first embodiment of the invention. In this drawing, the substrate 201 supporting the first insulator layer 203 and the bottom contact 205 are shown. A low-k dielectric material such as silicon dioxide ($SiO_2$), doped silicon glass (USG), fluorine-doped silicon glass (FSG) is used as the first insulator layer 203 and formed by well-known and conventional processes such as, for example, CVD, PECVD, and/or spin-on coating. The thickness of the dielectric material may vary depending on the technique used to form the dielectric as well as the material make-up of the layer. Typically, the layer of dielectric material 203 has a thickness from 50 nm to 800 nm, with a thickness from 80 nm to 300 nm being more typical. In embodiments of the invention, copper is used as the main metal in the bottom contact 205. In alternative embodiments, other metals such as Al, Al(Cu), Co, Ru, Ni, Ir, Rh and W are used. Conventional deposition processes such as atomic layer deposition (ALD), chemical vapor deposition (CVD), plasma enhanced chemical vapor deposition (PECVD), electroless plating are used to deposit the metals or alloys in respective embodiments which make the bottom contact 205.

The barrier layer 207 prevents diffusion of the copper 205 into the dielectric 203. Suitable barrier layer materials include Ta, Ti, W, Co, Ru, and their nitride materials, TaN, TiN, WN, CoN, RuN and a combination thereof. Conventional deposition processes such as atomic layer deposition (ALD), chemical vapor deposition (CVD), plasma enhanced chemical vapor deposition (PECVD) are used to deposit the barrier layers in respective embodiments.

After the dielectric 203, barrier layer 207 and bottom contact 205 are formed, and a capping layer 217 is deposited on the structure. Next, a mask deposition, a lithography step, an etch step and mask removal step are performed to create a recess. These processes are well known to the art. The bottom electrode 209 and the barrier layer 211 are formed in the recess as the first components of the RRAM cell. In preferred embodiments, tungsten (W) is used as the bottom electrode 209 and is deposited in a selective deposition. CVD or ALD can be used in the selective deposition. The barrier layer 211 is TaN in preferred embodiments and also deposited in a selective deposition. Note that the recess is only partially filled by the bottom electrode 209 and the barrier layer 211. In preferred embodiments, the height of the recess is in a range of 10 nm 100 nm.

The capping layer 217 is SiC in preferred embodiments. The capping layer 217 is typically a dielectric and formed by a conventional deposition process such as, for example, CVD, PECVD, chemical solution deposition, or evaporation. In addition to SiC, the dielectric capping layer 217 is $Si_4NH_3$, $SiO_2$, a carbon doped oxide, a nitrogen and hydrogen doped silicon carbide (SiC (N,H)), or multilayers thereof, in other embodiments of the invention. In preferred embodiments, the thickness of the capping layer 217 is in a range of 20 nm-500 nm.

Figure 6:
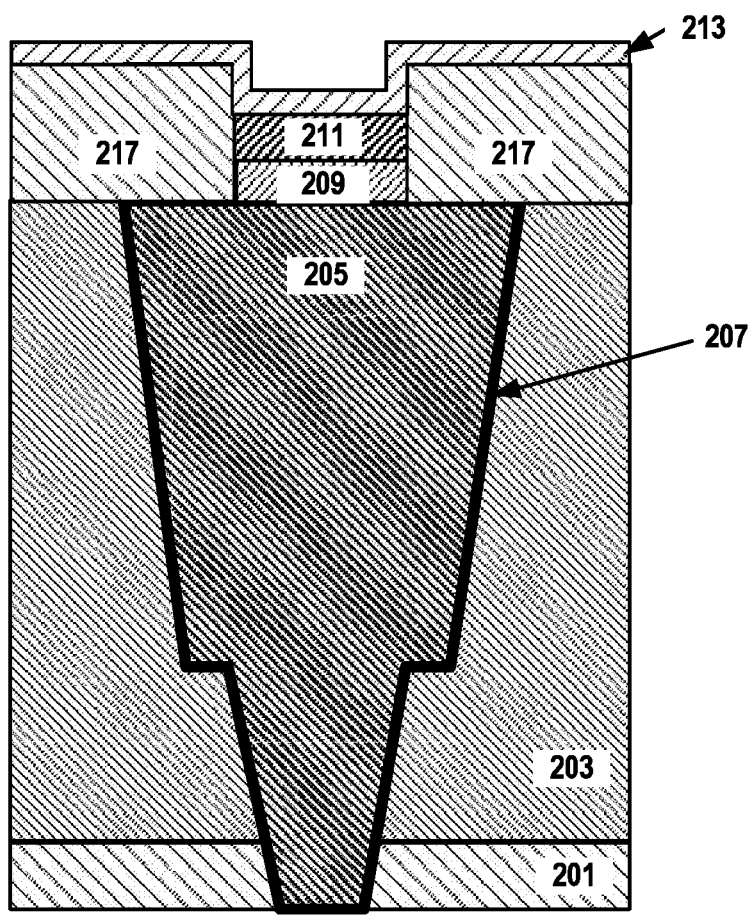
FIG. 6 is a cross-sectional diagram of the structure after a high-K deposition in the process used to fabricate the first embodiment of the invention.

FIG. 6 is a cross-sectional diagram of the structure after a high-K dielectric deposition in the process used to fabricate the first embodiment of the invention. Note that the high-K layer 213 has a stepped profile because of the topography of the partially filled recess. In one embodiment, the high-K dielectric layer 213 is preferably comprised of a composite of a metal, Si and O. Other embodiments use a "variable-resistance material" which is a metal oxide, including, but not limited to, nickel oxide (NiO), titanium dioxide (TiO), zinc oxide (ZηO), zirconium oxide (ZrO), hafnium oxide (HfO), tantalum oxide (TaO) or other transition metal oxides (TMO). Conventional deposition processes such as PVD, atomic layer deposition (ALD), chemical vapor deposition (CVD), plasma enhanced chemical vapor deposition (PECVD) are used to deposit the high-K layer 213 in respective embodiments. In embodiments of the invention, the thickness of the high-K layer 213 is between 5 Angstroms and 50 nm, with a preferred range of 1 nm~20 nm. As shown, the high-K layer 213 is less than the recess height.

Figure 7:
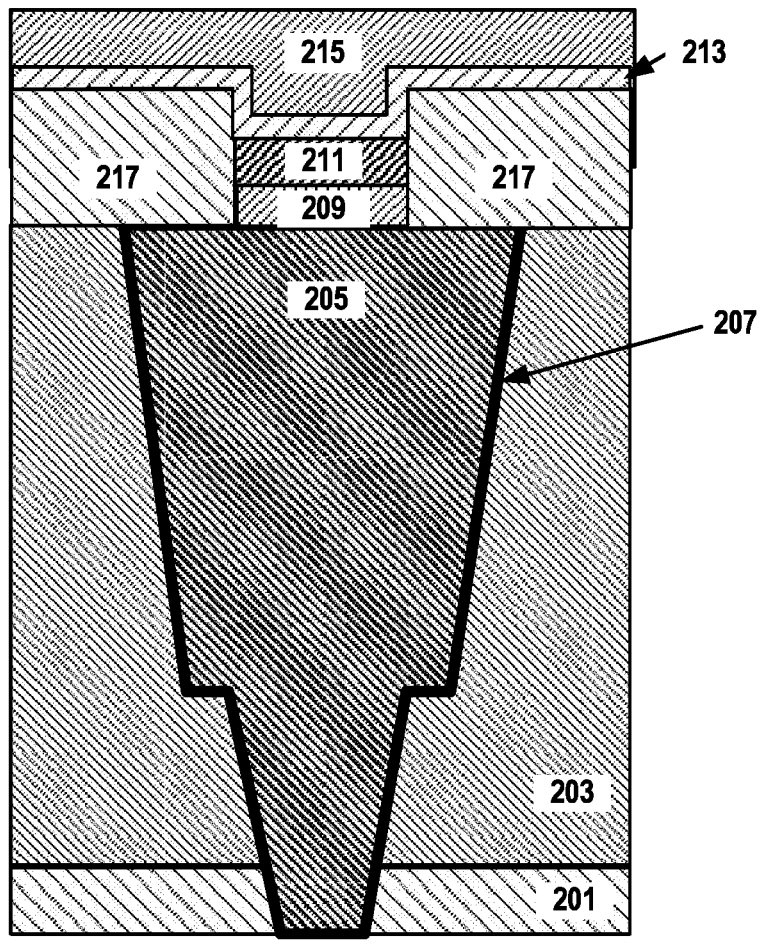
FIG. 7 is a cross-sectional diagram of the structure after a top metal deposition and planarization step in the process used to fabricate the first embodiment of the invention.

FIG. 7 is a cross-sectional diagram of the structure after a top metal deposition and planarization step in the process used to fabricate the first embodiment of the invention. In this drawing, the top electrode layer 215 is deposited and is comprised of metal or another conductive material such as a metal nitride. In preferred embodiments, a TaN layer is used. Conventional deposition processes such as PVD, atomic layer deposition (ALD), chemical vapor deposition (CVD), plasma enhanced chemical vapor deposition (PECVD) are used to deposit the top electrode layers in respective embodiments. A portion of the top electrode layer 215 is deposited into the remaining recess formed in the capping layer 217. Thus, the top electrode layer can be characterized by a stepped bottom surface and a planar top surface. A chemical mechanical polishing (CMP) step is performed in embodiments of the invention. A planarization step has been performed to planarize the top of the top electrode layer 215. Typically, a CMP process uses an abrasive and corrosive chemical slurry (commonly a colloid) in conjunction with a polishing pad. The pad and wafer are pressed together by a dynamic polishing head and held in place by a retaining ring. Other planarization processes are known to the art and are used in alternative embodiments of the invention.

Figure 8:
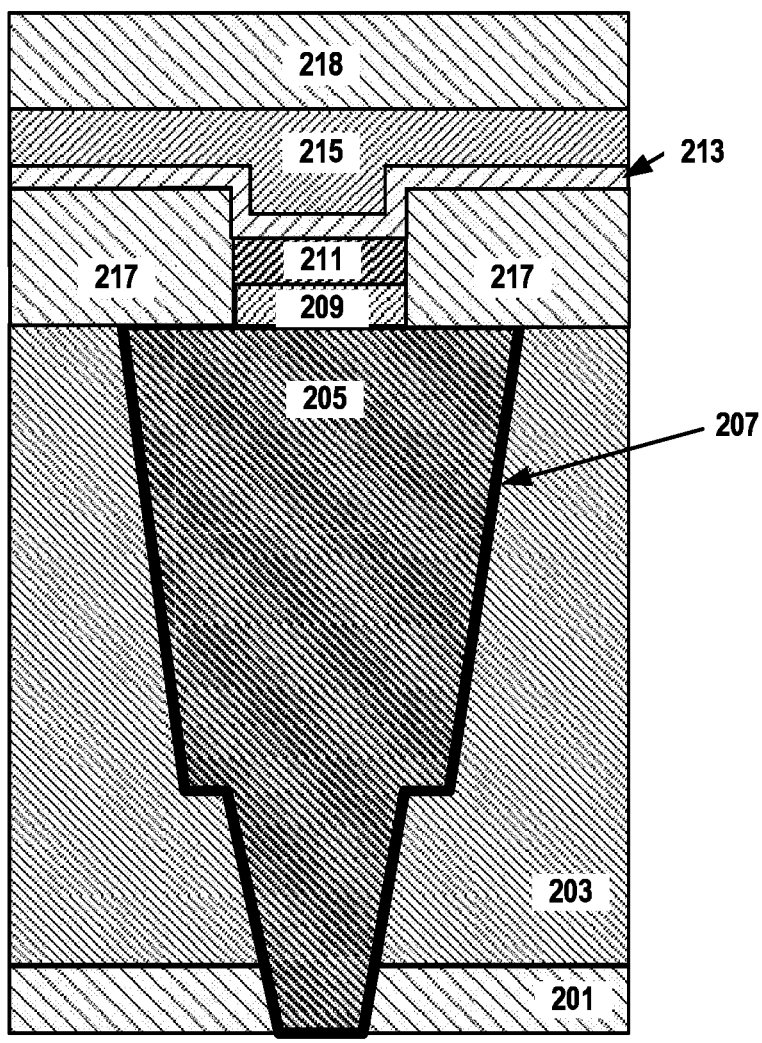
FIG. 8 is a cross-sectional diagram of the structure after a capping layer deposition in the process used to fabricate the first embodiment of the invention.

FIG. 8 is a cross-sectional diagram of the structure after a second capping layer deposition in the process used to fabricate the first embodiment of the invention. The drawing shows a capping layer 218 deposited over the top electrode layer 215. In preferred embodiments, the same capping layer material, e.g., SiC, is used for layer 218 as was used for layer 217. In alternative embodiments, a different material such as SiN, or Si(C, N) could be used as the capping layer. In preferred embodiments, a thickness between 20 nm~500 nm is selected for capping layer 281. A conventional CVD or PECVD process is used in embodiments of the invention to deposit the capping layer.

Figure 9:
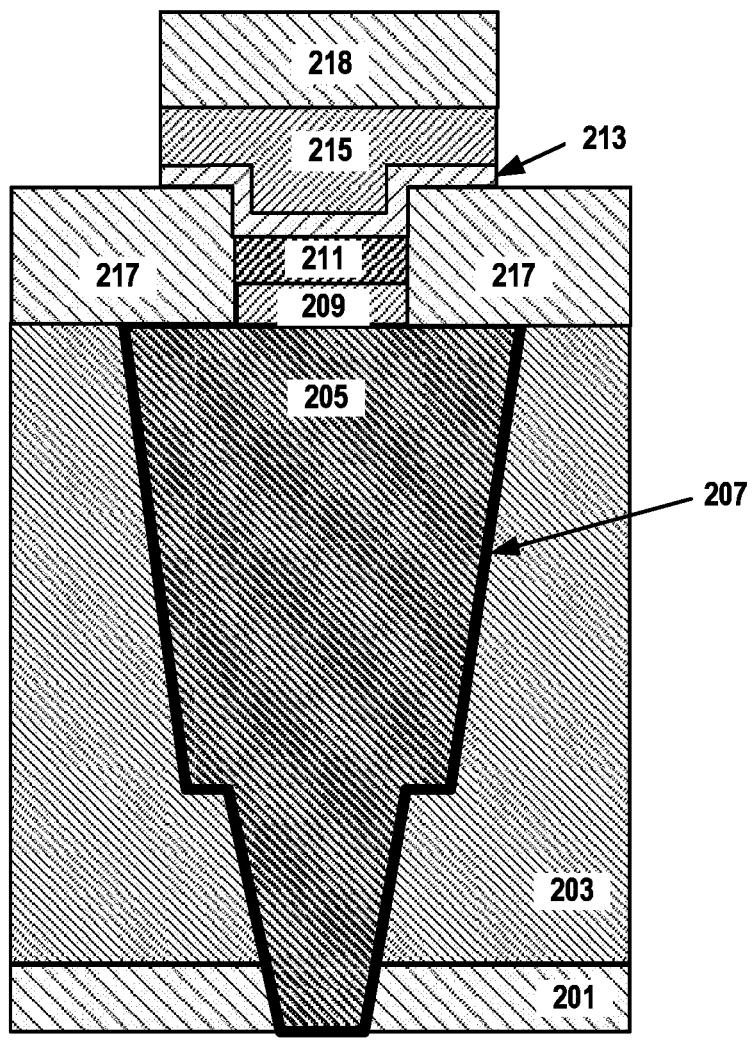
FIG. 9 is a cross-sectional diagram of the structure after an etch step defining the top electrode in the process used to fabricate the first embodiment of the invention.

FIG. 9 is a cross-sectional diagram of the structure after an etch step defining the top electrode in the process used to fabricate the first embodiment of the invention. As shown in the drawing, a lithography step followed by an etch step is used to define the top electrode 215 and high-K layer 213 widths. The high-K layer 213 has both a bottom stepped profile and a stepped top profile. Note that in preferred embodiments, the top electrode 215 and high-K layer 213 are wider than the bottom electrode layers 211, 209. In these embodiments, the top electrode 215 is at least 10 nm greater in width than the width of the bottom electrode 209, i.e. there is more than a 5 nm overhang on each side. Both the increased width of the top electrode 215 and increased distance from the bottom electrode 209 due to the stepped profile are helpful in reducing the possibility that misalignment of the top contact will cause a short.

Figure 10:
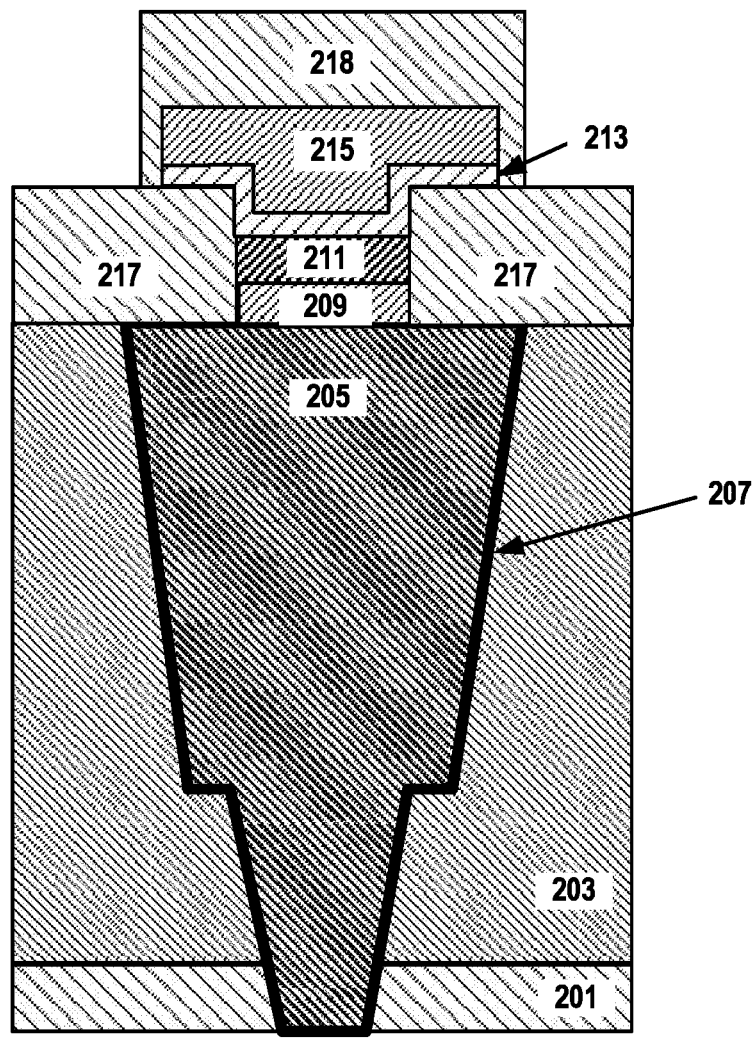
FIG. 10 is a cross-sectional diagram of the structure after a third capping layer deposition in the process used to fabricate the first embodiment of the invention.

FIG. 10 is a cross-sectional diagram of the structure after a third capping layer deposition in the process used to fabricate the first embodiment of the invention. In preferred embodiments, the third capping layer is the same as those used in prior capping layers and completes the encapsulation of the RRAM cell. The capping layers are shown as a single element 218 though they are formed in multiple steps. In alternative embodiments, the capping layers are of different capping materials. As mentioned above, suitable capping layers include SiN, SiC and Si(C, N). The vertical sidewall is preferably between 2 nm~100 nm in thickness and is deposited by a CVD or PECVD process.

The final structure in the first embodiment in the misalignment case is shown in FIG. 3; because of the greater distance in both the lateral dimension (the increased width of the high-K layer 213 and top electrode 215 as compared to the bottom electrode 209) and the increased height or distance in the vertical dimension (because of the stepped profile of the high-K layer 213), shorts between the top contact 223 and the lower electrode 211, 209 are reduced as compared to the prior art.

Figure 11:
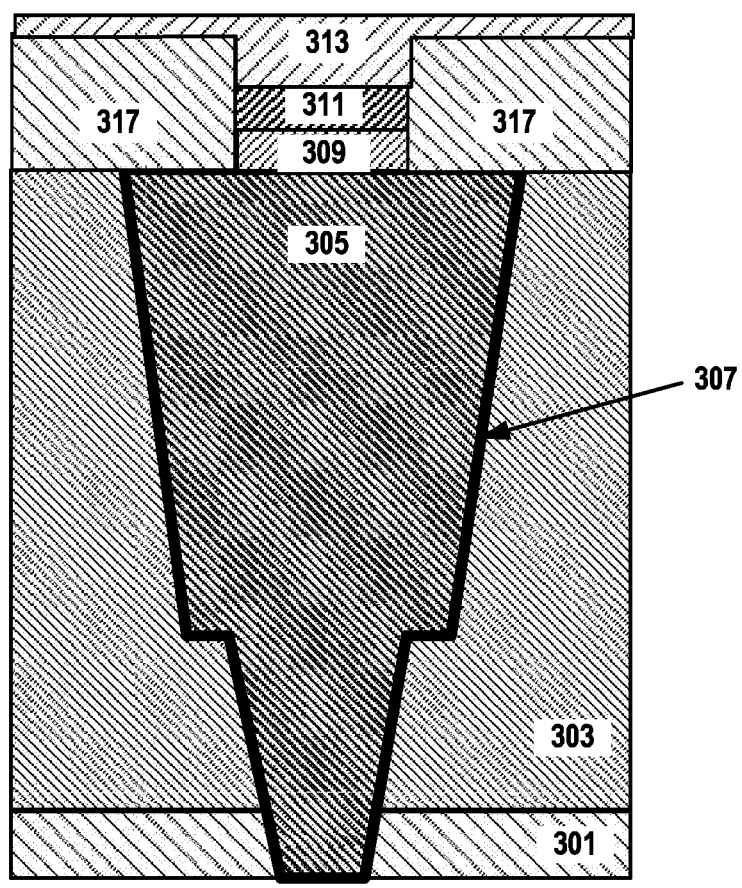
FIG. 11 is a cross-sectional diagram of the structure after a high-K deposition in the process used to fabricate the second embodiment of the invention.

FIG. 11 is a cross-sectional diagram of the structure after a high-K deposition in the process used to fabricate the second embodiment of the invention. This drawing is comparable to FIG. 6 of the first embodiment. The substrate 301 supports the first insulator layer 303 and the bottom contact 305. The barrier layer 307 prevents diffusion of the copper into the dielectric 303. In this and the first embodiment, the barrier layer 307 is optional as a metal which does not diffuse into the dielectric may be used as the bottom contact 305. Similar materials and processes to deposit the materials are used as those described above in association with the first embodiment.

The bottom electrode 309 and the barrier layer 311 are the components of the lower electrode of the RRAM cell. Again, the recess in the capping layer 317 is only partially filled by the bottom electrode 309 and the barrier layer 311. Similar materials and processes are those described above are used for the bottom electrode 309 and the barrier layer 311. The capping layer 317 layer is preferably comprised of SiC in one embodiment. Also shown is the high-K layer 313. In this embodiment, a thicker layer of the high-K dielectric 313 is deposited as compared to the first embodiment. After deposition, a planarization step such as CMP is performed to planarize the top surface of high-K layer 313. Thus, while the high-K layer 313 shares the bottom stepped profile of the first embodiment, in the second embodiment, it has a planar top surface instead of the stepped top profile of the first embodiment.

In this embodiment, the wings should be greater than 5 nm in width, adding at least 10 nm in width to the overall width of the high-K layer 313. In this embodiment, the high-K layer thickness is greater than in the first embodiment. For example, preferably the deposited high-k layer is greater than the height of the remaining recess (after the bottom electrode layers are deposited) shown in FIG. 5.

Figure 12:
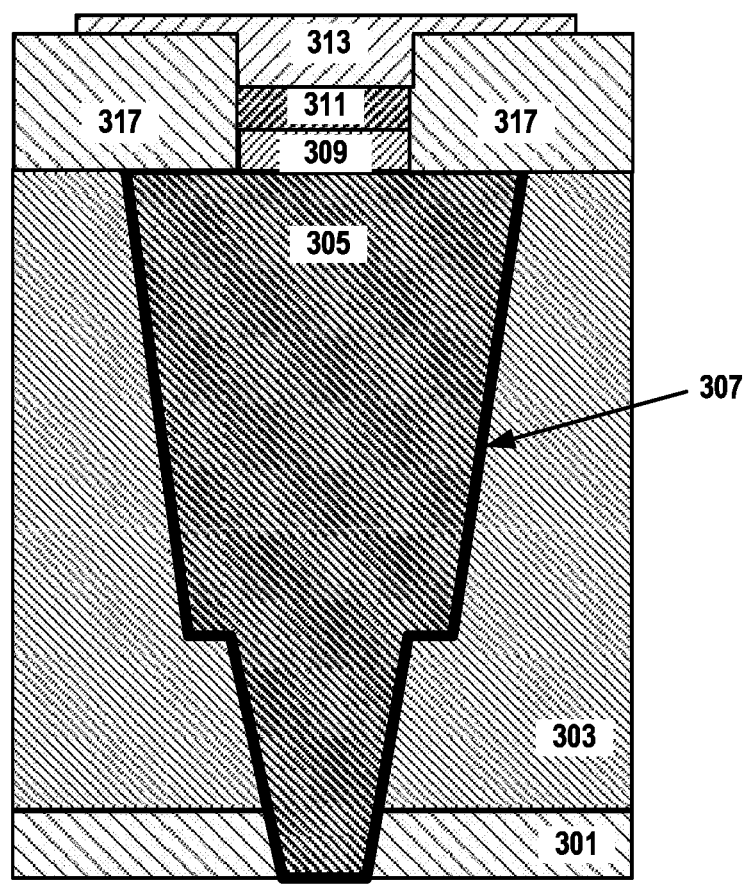
FIG. 12 is a cross-sectional diagram of the structure after a patterning step in the process used to fabricate the second embodiment of the invention.

FIG. 12 is a cross-sectional diagram of the structure after a patterning step in the process used to fabricate the second embodiment of the invention. The drawing shows the structure after lithography, etch and mask strip steps have been performed. Note that unlike the conformal layer shown in the first embodiment, the high-K layer 313 has two thicknesses, a first, thicker layer over the lower electrode and thinner "wings" over the capping layer 317. In this embodiment, the high-K layer 313 is patterned in a separate step from the top electrode (see next drawings) unlike the first embodiment where both layers are patterned in the same steps.

Figure 13:
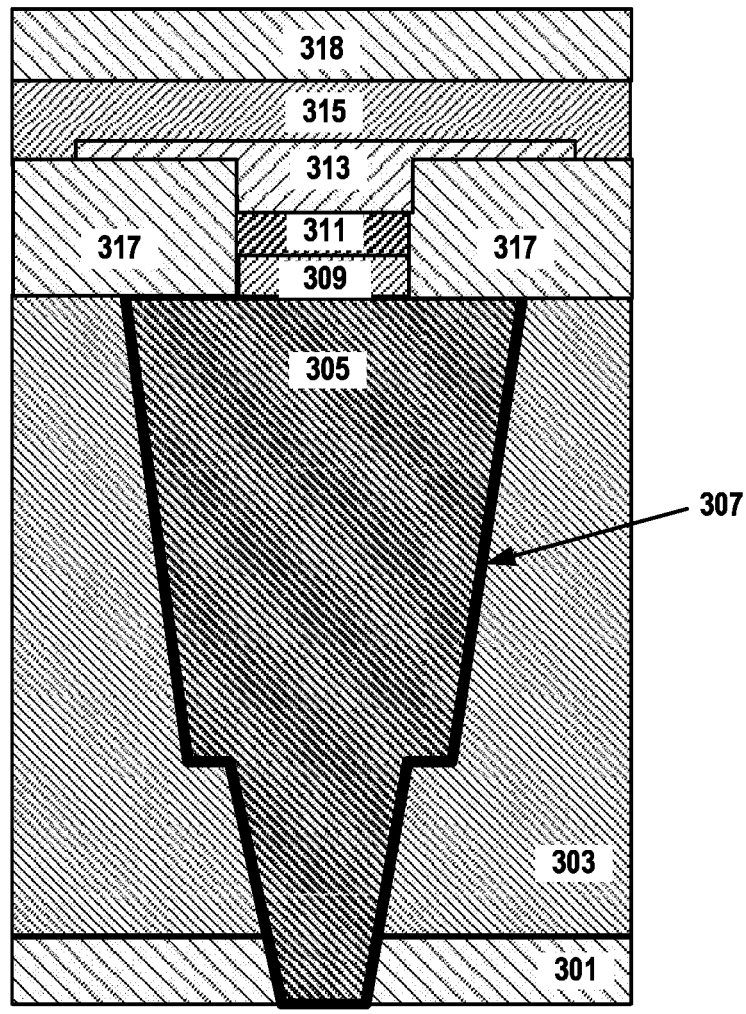
FIG. 13 is a cross-sectional diagram of the structure after a metal deposition, planarization step and dielectric deposition in the process used to fabricate the second embodiment of the invention.

FIG. 13 is a cross-sectional diagram of the structure after a metal deposition, planarization step and capping layer deposition in the process used to fabricate the second embodiment of the invention. The metal layer 315 is disposed on the high-K layer 313. In turn, the capping layer 318 is disposed on the metal layer 315. This structure is comparable to that shown in FIG. 8 for the first embodiment in terms of the respective points in the processes. Similar materials and processes can be used in the second embodiment as are used in the first embodiment.

Figure 14:
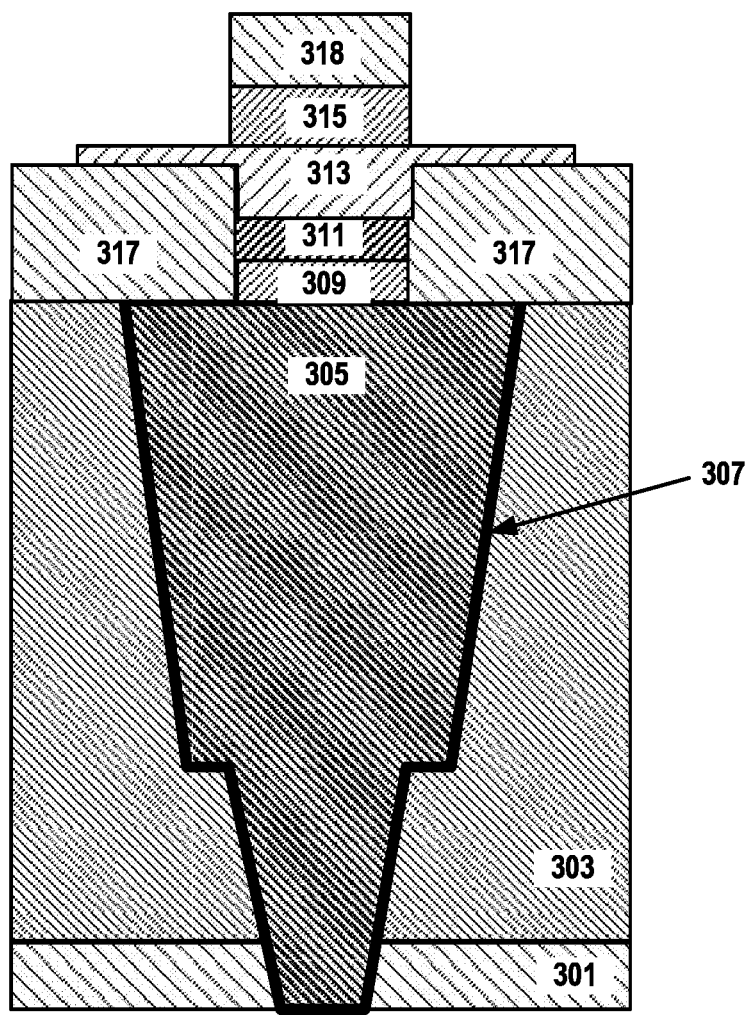
FIG. 14 is a cross-sectional diagram of the structure after an etch step defining the top electrode in the process used to fabricate the second embodiment of the invention.

FIG. 14 is a cross-sectional diagram of the structure after an etch step defining the top electrode in the second embodiment of the invention. As compared to the first embodiment, the top electrode 315 has a different, narrower width than the width of the high-K layer 313 at its width at the wings. Although the top electrode 315 and bottom electrode layers 309, 311 are depicted as having the substantially the same width in the drawing, that is not a requirement of the embodiment. For example, the top electrode 315 may have a wider width than the bottom electrode 311, 309.

Figure 15:
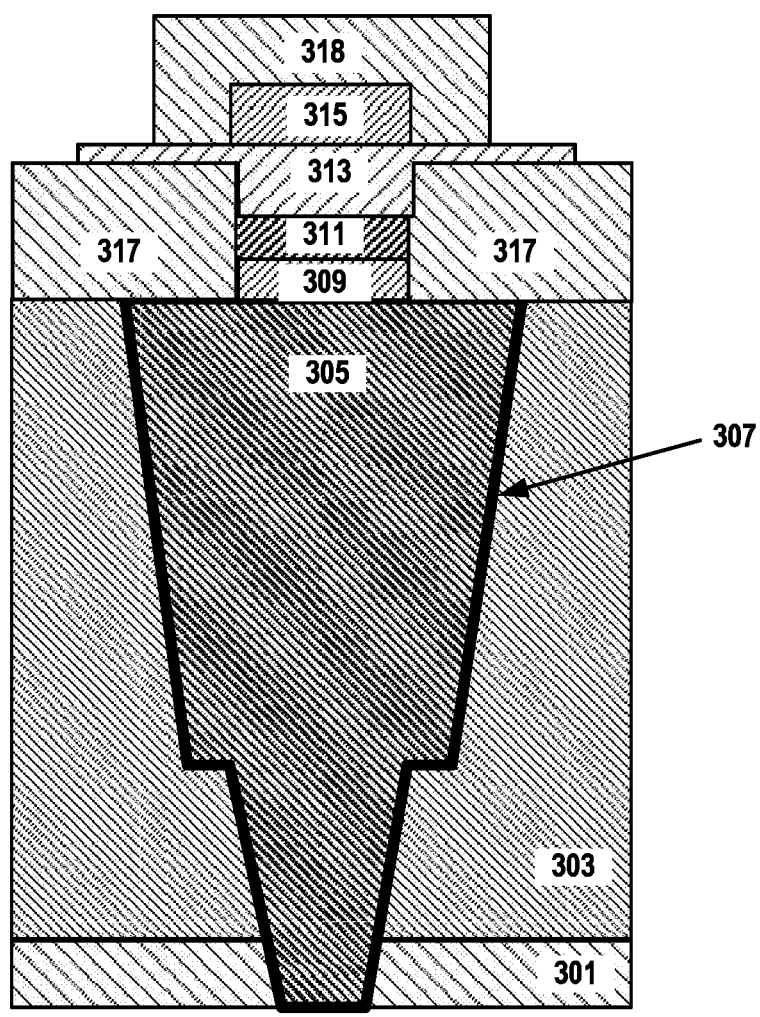
FIG. 15 is a cross-sectional diagram of the structure after a second dielectric deposition in the process used to fabricate the second embodiment of the invention.

FIG. 15 is a cross-sectional diagram of the structure after a second dielectric deposition in the process used to fabricate the second embodiment of the invention. In the drawing, additional capping layer material 318 material has been deposited at the sides of the top electrode 315. As in the first embodiment, capping material 318 is made of multiple layers and may be made of different capping layer materials.

The final structure for the second embodiment is shown in FIG. 4. The greater width of the wings of the high-K layer 313 as compared to widths of the bottom electrode layers 309, 311 reduces the opportunity for shorts between the top contact and the lower electrode as compared to the prior art.

The resulting structures can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating a resistive random access memory (RRAM) device, comprising:
   providing a capping layer over a bottom contact, the capping layer including a recess situated over the bottom contact;
   partially filling a first portion of the recess with a planar lower electrode layer, wherein a width of the recess defines a width of the planar lower electrode layer;
   partially filling a second portion of the recess with a planar barrier layer using a selective deposition, wherein the width of the recess defines a width of the planar barrier layer;
   filling a third portion of the recess with a high-K layer, so that a bottom surface of the high-K layer has a stepped profile and a portion of the bottom surface of the high-K layer contacting a top surface of the capping layer;
   forming a top electrode on the high-K layer;
   forming a top contact on the top electrode; and
   wherein a width of the high-K layer is greater than the width of the planar lower electrode layer and the width of the planar barrier layer to prevent shorting between the top contact and the planar lower electrode layer or between the top contact and the planar barrier layer of the RRAM device.

2. The method as recited in claim 1, wherein the top electrode fills a fourth portion of the recess, and the high-K layer has a top surface with a stepped profile.

3. The method as recited in claim 2, wherein the width of the high-K layer and a width of the top electrode are equal in a dimension, and the method further comprises etching the high-K layer and the top electrode in an etch process using a single mask wherein the etch process stops at the top surface of the capping layer.

4. The method as recited in claim 1, wherein a conformal thickness of high-K material is deposited, and the top electrode has a stepped bottom surface and a planarized top surface.

5. The method as recited in claim 1, wherein the step of filling the first portion of the recess with the lower electrode is performed by a selective deposition.

6. The method as recited in claim 5, wherein the planar lower electrode layer is comprised of TiN.

7. The method as recited in claim 6, wherein forming the top electrode further comprises a planarization step.

8. The method as recited in claim 1, wherein the high-K layer has a planarized top surface, and the high-k layer has a first thickness over the planar lower electrode layer and a second thickness over the capping layer, the first thickness is greater than the second thickness.

9. The method as recited in claim 1, further comprising:
   defining the width of the high-K layer in a first set of masking and etch steps; and
   defining a width of the top electrode in a second set of masking and etch steps.

10. The method as recited in claim 9, wherein the width of the high-K layer is greater than the width of the top electrode.

11. The method as recited in claim 1, wherein the planar barrier layer is disposed between the planar lower electrode layer and the high-K layer.

12. The method as recited in claim 1, wherein the planar barrier layer and the planar lower electrode layer have planar lower and top surfaces.

13. The method as recited in claim 1, wherein the top surface of the capping layer is planar and extends horizontally beyond an edge of the top electrode.

14. A method for fabricating a resistive random access memory (RRAM) device, comprising:
- providing a capping layer over a bottom contact, the capping layer including a recess situated over the bottom contact;
- partially filling a first portion of the recess with a planar lower electrode layer and a second portion of the recess with a planar barrier layer using a selective deposition, wherein a width of the recess defines a width of the planar lower electrode layer and a width of the planar barrier layer;
- filling a third portion of the recess with a high-K layer, so that a bottom surface of the high-K layer has a stepped profile and a portion of the bottom surface of the high-K layer contacts a top surface of the capping layer;
- forming a top electrode on the high-K layer, wherein the top surface of the capping layer is planar and extends horizontally beyond an edge of the top electrode; and
- wherein a width of the high-K layer is greater than the width of the planar lower electrode layer and the width of the planar barrier layer to prevent shorting between the top contact and either the planar lower electrode layer or the planar barrier layer of the RRAM device.

15. The method as recited claim 14, wherein a width of the top electrode is equal to the width of the high-K layer and the width of the top electrode and high-K layer are at least 10 nm greater than the width of the planar lower electrode.

* * * * *